United States Patent
Kwon et al.

(10) Patent No.: US 6,541,136 B1
(45) Date of Patent: Apr. 1, 2003

(54) SUPERCONDUCTING STRUCTURE

(75) Inventors: Chuhee Kwon, Los Alamos, NM (US); Quanxi Jia, Los Alamos, NM (US); Stephen R. Foltyn, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/152,813

(22) Filed: Sep. 14, 1998

(51) Int. Cl.$^7$ ............................ H01L 39/00; H01B 12/00
(52) U.S. Cl. ........................ 428/701; 428/702; 505/234
(58) Field of Search .................................. 428/701, 702, 428/693, 697, 679, 930; 505/234, 235, 237, 238, 239, 190, 701, 702

(56) References Cited

U.S. PATENT DOCUMENTS

| | | | | |
|---|---|---|---|---|
| 4,948,779 A | * | 8/1990 | Keur et al. | 257/662 |
| 5,087,605 A | * | 2/1992 | Hegde et al. | 257/33 |
| 5,106,823 A | * | 4/1992 | Creuzet et al. | 257/33 |
| 5,162,294 A | * | 11/1992 | Talvacchio et al. | 204/192.24 |
| 5,326,747 A | * | 7/1994 | Inada et al. | 216/3 |
| 5,372,992 A | * | 12/1994 | Itozaki et al. | 428/688 |
| 5,512,541 A | * | 4/1996 | Konishi et al. | 117/108 |
| 5,712,227 A | * | 1/1998 | Higaki et al. | 428/701 |
| 5,869,431 A | * | 2/1999 | Veal et al. | 427/62 |
| 6,157,044 A | * | 12/2000 | Nakanishi et al. | 257/31 |

FOREIGN PATENT DOCUMENTS

| | | | |
|---|---|---|---|
| WO | WO 00/16412 | * | 3/2000 |
| WO | WO 00/22652 | * | 3/2000 |

OTHER PUBLICATIONS

Kwon et al., "High critical current densities in ultrathin YBa2Cu3O(7–beta) films sandwiched between (PrXY(1–X))Ba2Cu3O(7–beta) layers" Mar. 15, 1993, Applied Physics Letters 62(11), pp. 1289–1291.*

* cited by examiner

Primary Examiner—Tom Dunn
Assistant Examiner—Collen P. Cooke
(74) Attorney, Agent, or Firm—Bruce H. Cottrell

(57) ABSTRACT

A superconductive structure including a dielectric oxide substrate, a thin buffer layer of a superconducting material thereon; and, a layer of a rare earth-barium-copper oxide superconducting film thereon the thin layer of yttrium-barium-copper oxide, the rare earth selected from the group consisting of samarium, gadolinium, ytterbium, erbium, neodymium, dysprosium, holmium, lutetium, a combination of more than one element from the rare earth group and a combination of one or more elements from the rare earth group with yttrium, the buffer layer of superconducting material characterized as having chemical and structural compatibility with the dielectric oxide substrate and the rare earth-barium-copper oxide superconducting film is provided.

8 Claims, 2 Drawing Sheets

SUPERCONDUCTING STRUCTURE

This invention was made with government support under Contract No. W-7405-ENG-36 awarded by the U.S. Department of Energy. The government has certain rights in the invention.

FIELD OF THE INVENTION

The present invention relates to superconducting structures and to a method of improving superconducting properties of selected $(RE)Ba_2Cu_3O_7$ films, where RE is a selected rare earth element.

BACKGROUND OF THE INVENTION

Since the discovery of high-temperature superconducting (HTS) materials (superconducting above the liquid nitrogen temperature of 77 K) there have been efforts to research and develop various technology and engineering applications using such HTS materials. In thin film superconductor devices, the most progress has been made with fabrication of Josephson junctions and microwave devices utilizing an oxide superconductor including yttrium, barium, copper and oxide in the well-known basic composition of $YBa_2Cu_3O_{7-x}$ (hereinafter referred to as Y123). At liquid nitrogen temperatures and in high magnetic fields, the $J_c$ of Y123 is superior to those of the bismuth, thallium and mercury based HTS materials. Thus, Y123 has generally been the preferred material for thin film and bulk applications.

Even though Y123 is the material of choice for HTS applications, it still has a few problems. One problem is that Y123 has one of the lowest $T_c$'s among $(RE)Ba_2Cu_3O_{7-x}$ materials (hereinafter referred to as RE123) which can limit $J_c$ at the liquid nitrogen temperature (since $J_c$ depends on $T_c$; $J_c \approx (1-T/T_c)^{3/2}$). Another problem is that compared with $SmBa_2Cu_3O_7$ (Sm123) and $NdBa_2Cu_3O_7$ (Nd123) films, Y123 films have a much rougher surface morphology which is detrimental for any device application and imposes a materials challenge. Still another problem is that it has been known that Nd123 has a larger $J_c$ in high magnetic fields than Y123. Hence, it has been important to continue development of RE123 films for various HTS applications. Previously, there have been some efforts to fabricate high quality RE123 films. Sm123 and Nd123 films with good superconducting properties ($T_c>90$ K and $J_c>10^6$ Amperes per square centimeter ($A/cm^2$)) and smooth surface morphology have been fabricated using Pulsed Laser Deposition (PLD), Molecular Beam Epitaxy (MBE), and Coevaporation techniques. However, the optimization of film properties has only been achieved by using barium-rich targets, post-annealing of the films, or changing the stoichiometry of the targets, and it has been difficult to reproducibly fabricate high quality films.

There have been several attempts to overcome these difficulties by using a buffer layer to produce RE123 films. For example, U.S. Pat. No. 5,232,900 describes the use of a non-superconducting buffer layer. U.S. Pat. No. 5,512,541 describes the deposition of superconducting films on a superconducting single crystal substrate. U.S. Pat. No. 5,629,268 describes the deposition of multilayers on a bottom superconductor without damaging its superconducting properties. Kwon et al., Appl. Phys. Lett., 62, 1289–1291 (1993), describe a buffer layer of yttrium-doped Pr123 in order to improve the superconducting properties of ultra-thin Y123 films.

Despite these earlier efforts, the need to find additional buffer materials suitable for reproducible deposition of various RE123 films has remained. Thus, an object of the present invention is buffer materials suitable for reproducible deposition of various RE123 films.

Another object of the present invention is to simplify the process conditions needed to form various RE123 films.

SUMMARY OF THE INVENTION

To achieve the foregoing and other objects, and in accordance with the purposes of the present invention, as embodied and broadly described herein, the present invention provides a superconductive structure including a dielectric oxide substrate, a thin buffer layer of a superconducting oxide material thereon; and, a layer of a rare earth-barium-copper oxide superconducting film thereon the thin layer of yttrium-barium-copper oxide, the rare earth selected from the group consisting of samarium, gadolinium, ytterbium, erbium, neodymium, dysprosium, holmium, lutetium, a combination of more than one element from the rare earth group and a combination of one or more elements from the rare earth group with yttrium, the buffer layer of superconducting material characterized as having chemical and structural compatibility with the dielectric oxide substrate and the rare earth-barium-copper oxide superconducting film. Preferably, the superconducting material characterized as having chemical and structural compatibility with the superconducting (rare-earth)-barium-copper oxide is yttrium-barium-copper oxide.

The present invention also provides a method of improving the superconducting properties of a superconducting (rare-earth)-barium-copper oxide structure by use of a thin layer of a superconducting material characterized as having chemical and structural compatibility with the superconducting (rare-earth)-barium-copper oxide as a buffer layer situated directly between a dielectric oxide substrate and the layer of superconducting (rare-earth)-barium-copper oxide. Preferably, the superconducting material characterized as having chemical and structural compatibility with the superconducting (rare-earth)-barium-copper oxide is yttrium-barium-copper oxide.

DETAILED DESCRIPTION

Figure 1:
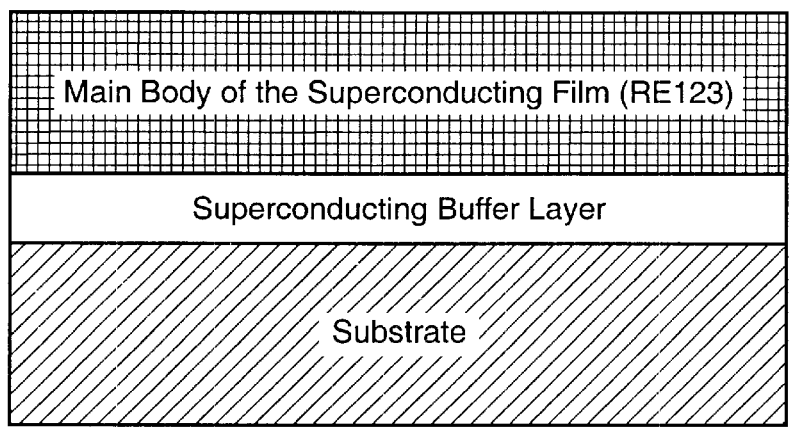
FIG. 1 shows a schematic structure of the superconducting structure of the present invention (layer thicknesses are not to scale).

The present invention is concerned with use of a buffer layer of superconducting material on an underlying base substrate of a dielectric oxide substrate to improve the properties of a multilayer structure including the underlying base substrate, the layer of the superconducting material, and a subsequently deposited superconducting (rare-earth)-barium-copper oxide.

The base substrate in the present invention can be a dielectric oxide such as lanthanum aluminum oxide ($LaAlO_3$), strontium titanate ($SrTiO_3$), magnesium oxide (MgO), strontium aluminum tantalum oxide ($Sr_2AlTaO_6$) or a solid solution of lanthanum aluminum oxide and strontium aluminum tantalum oxide (($LaAlO_3)_{0.3}(Sr_2AlTaO_6)_{0.7}$ and neodymium gadolinate ($NdGaO_3$), or can be a composite material such as cerium oxide with a buffer layer of yttria-stabilized zirconia ($CeO_2$/YSZ), aluminum oxide with a buffer layer of cerium oxide ($Al_2O_3/CeO_2$) or silicon with a buffer layer. The base substrate may also be a composite including a flexible metallic substrate such as nickel, nickel-alloys and the like with a suitable buffer layer upon the metal surface, such a buffer layer preferably being a material such as YSZ or MgO deposited by ion beam assisted deposition. Ion beam assisted deposition is described in U.S. Pat. Nos. 5,650,378, 5,432,151, and in allowed U.S. patent application Ser. No. 08/425,752, filed Apr. 19, 1995.

The buffer layer in the structure of the present invention is a thin layer of a superconducting material that is chemically and structurally compatible with a subsequently deposited superconducting film. Generally, the thin buffer layer is of a RE123 film where the rare earth element is selected from those rare earth elements that have a relatively smaller cation size such as for yttrium, erbium, ytterbium and gadolinium. The RE123 film can be doped with a minor amount of, e.g., silver. Preferably, the thin buffer layer is of superconducting yttrium-barium-copper oxide, i.e., $YBa_2Cu_3O_{7-x}$ or of superconducting silver-doped yttrium-barium-copper oxide, i.e., Ag—$YBa_2Cu_3O_{7-x}$. The thin buffer layer is generally from about 5 nanometers (nm) to about 50 nm in thickness, preferably from about 10 nm to about 20 nm.

By "chemical compatibility" is meant that the material does not undergo property degrading chemical interactions with the subsequently deposited superconducting (rare-earth)-barium-copper oxide. By "structural compatibility" is meant that the material has a substantially similar lattice structure with the subsequently deposited superconducting (rare-earth)-barium-copper oxide.

The high temperature superconducting (HTS) material of the present invention can be any of the conventionally rare-earth-barium copper oxide (RE-$Ba_2Cu_3O_7$ or RE-BCO), where the rare earth metal is an individual metal from the group of samarium, gadolinium, ytterbium, erbium, neodymium, dysprosium, holmium, lutetium, or is a combination of rare earth metals such as, e.g., yttrium and samarium, yttrium and neodymium, yttrium and erbium, yttrium and holmium, yttrium and ytterbium, yttrium and dysprosium, neodymium and samarium, neodymium, samarium and europium, neodymium, europium and gadolinium, neodymium, samarium, europium and gadolinium, and the like. The thickness of the superconducting top layer is generally from about 5 nanometers (nm) to about 500 nm in thickness, preferably from about 10 nm to about 200 nm, although thicker films may also be employed.

The various material layers can be deposited by pulsed laser deposition or by other well known methods such as evaporation, sputtering, or chemical vapor deposition. Pulsed laser deposition is the preferred deposition method.

In pulsed laser deposition, powder of the desired material, e.g., YBCO, can be initially pressed into a disk or pellet under high pressure, generally above about 500 pounds per square inch (PSI) and the pressed disk then sintered in an oxygen-containing atmosphere for at least about one hour, preferably from about 12 to 24 hours. An apparatus suitable for the pulsed laser deposition is shown in Appl. Phys. Lett., 56, 578(1990), "effects of beam parameters on excimer laser deposition of $YBa_2Cu_3O_{7-x}$", such description hereby incorporated by reference.

Suitable conditions for pulsed laser deposition include, e.g., the laser, such as a XeCl excimer laser (20 nanoseconds (ns), 308 nanometers (nm)), targeted upon a rotating pellet of the desired material at an incident angle of about 45°. The target substrate can be mounted upon a heated holder rotated at about 0.5 revolutions per minute (rpm) to minimize thickness variations in the resultant film or layer. The substrate can be heated during the deposition at temperatures from about 600° C. to about 950° C., preferably from about 700° C. to about 850° C., more preferably from about 700° C. to about 800° C. An oxygen atmosphere of from about 0.1 millitorr (mTorr) to about 10 Torr, preferably from about 100 mTorr to about 400 mTorr, can be maintained within the deposition chamber during the deposition. Distance between the substrate holder and the pellet can generally be from about 4 centimeters (cm) to about 10 cm.

The rate of formation of the thin films or layers can be varied from about 0.1 Angstrom per second (Å/s) to about 200 Å/s by changing the laser repetition rate from about 1 hertz (Hz) to about 200 Hz. As laser beam divergence is a function of the repetition rate, the beam profile can be monitored after any change in repetition rate and the lens focal distance adjusted to maintain a constant laser energy density upon the target pellet. Generally, the laser beam can have dimensions of about 3 millimeters (mm) by 4 mm with an average energy density of from about 1 to about 5 joules per square centimeter ($J/cm^2$), preferably from about 1.5 to about 3 $J/cm^2$.

Figure 2:
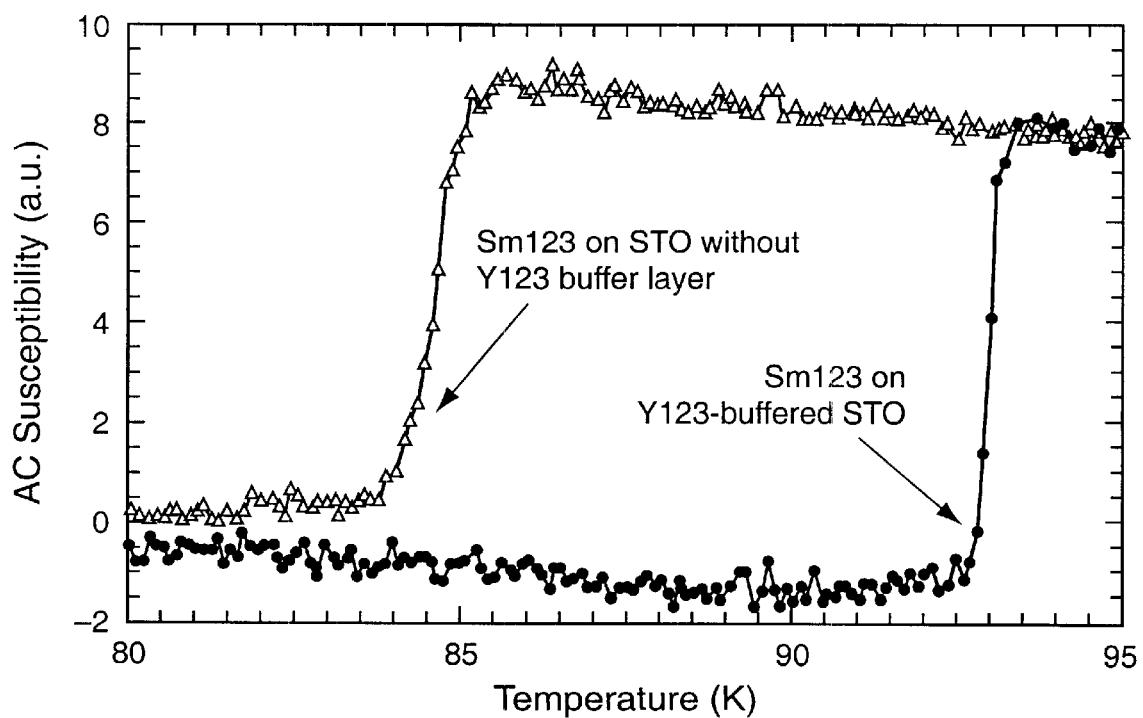
FIG. 2 shows the superconducting transitions of superconducting samarium-barium-copper oxide films, both with and without a buffer layer of superconducting yttrium-barium-copper oxide, as measured by AC susceptibility.
Figure 3:
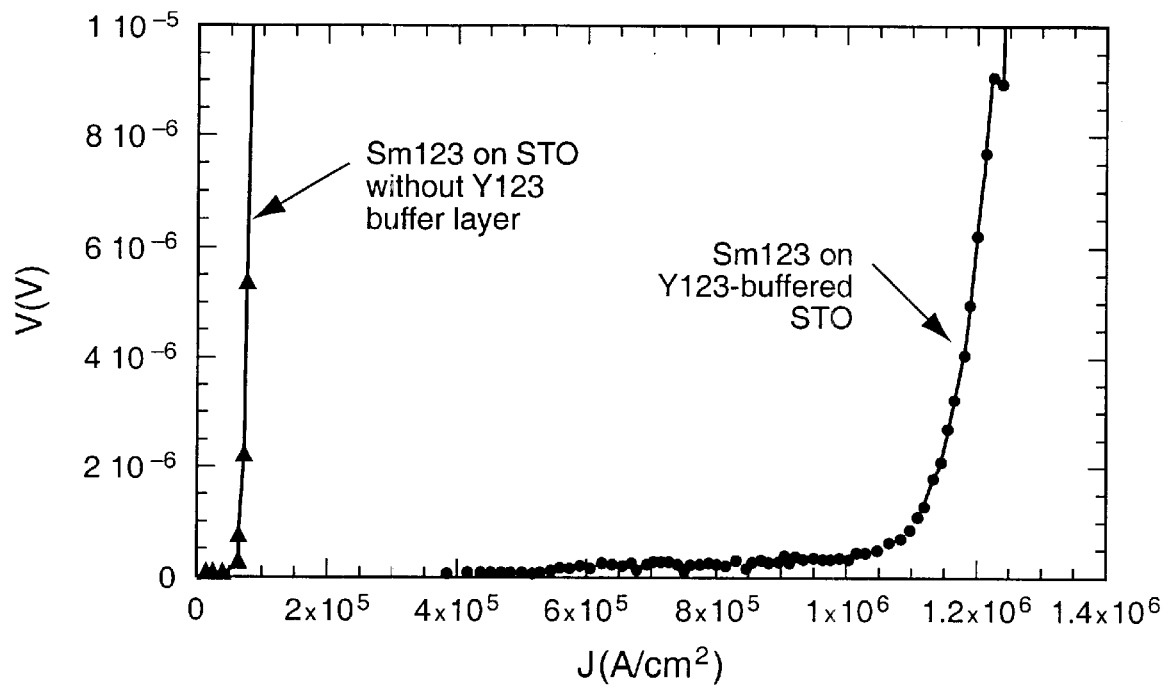
FIG. 3 shows the current-voltage plots for superconducting samarium-barium-copper oxide films, both with and without a buffer layer of superconducting yttrium-barium-copper oxide.

By use of the buffer layer of superconducting yttrium-barium-copper oxide, the superconducting properties of (rare-earth)-barium-copper oxides can be improved. For example, a 2000 Å thick samarium-barium-copper oxide film with a buffer layer of superconducting yttrium-barium-copper oxide showed improvements in transition temperature as shown in FIG. 2 and in critical current as shown in FIG. 3 in comparison with a 2000 Å thick samarium-barium-copper oxide film without the buffer layer. FIG. 2 shows the comparison of $T_c$ as measured by AC susceptibility between samarium-barium-copper oxide films with and without the buffer layer upon a strontium titanate substrate. The samarium-barium-copper oxide film with the buffer layer had a higher $T_c$ and a sharper superconducting transition. As seen in the data of FIG. 3, the samarium-barium-copper oxide film with the buffer layer had a much higher critical current than without the buffer layer.

The present invention is more particularly described in the following examples, which are intended as illustrative only, since numerous modifications and variations will be apparent to those skilled in the art.

EXAMPLE 1

A series of structures with various substrates ($LaAlO_3$), ($SrTiO_3$), ($NdGaO_3$), and ($CeO_2$/YSZ) were formed both with and without a buffer layer of superconducting yttrium-barium-copper oxide and a superconducting samarium-barium-copper oxide film. The thin films of yttrium-barium-copper oxide and samarium-barium-copper oxide were deposited onto the substrates by in situ pulsed laser deposition (PLD) using a 308 nm XeCl excimer laser and the same processing conditions. On $LaAlO_3$ substrates, the substrate temperature range for deposition was varied between about 760° C. and about 815° C. with the highest $T_c$ without the buffer layer obtained at 795° C. and at 10 MHz for a deposition rate of about 0.667 Å/s. Without the buffer layer, changing the substrate temperature to 785° C. or 805° C., or changing the laser repetition rate to 5 MHz dropped the $T_c$ to from 89 K–91 K. With the buffer layer, the superconducting samarium-barium-copper oxide film had a $T_c$ in excess of 92 K within a lower deposition substrate temperature range of 765° C. to 785° C. and at laser deposition rates of 5, 10 and 15 MHz. For the $NdGaO_3$ and $CeO_2$/YSZ substrates, the substrate temperature was 775° C. and laser repetition rate was 10 MHz for the superconducting samarium-barium-copper oxide film both with and without a buffer layer of superconducting yttrium-barium-copper oxide.

The superconducting transition temperatures were measured for the various structures and the results are given in Table 1.

TABLE 1

| Substrate | $T_c$ (no buffer layer) | $T_c$ (with buffer layer) |
|---|---|---|
| $LaAlO_3$ | 92.3 K | 93 K |
| $SrTiO_3$ | 85 K | 92.7 K |
| $NdGaO_3$ | <75 K | 92.0 K |
| $CeO_2$/YSZ | 85.4 K | 90.1 K |

In the case of $LaAlO_3$ substrate, high $T_c$ was obtained without the buffer layer in a narrow range of deposition temperatures and deposition rates (frequency of laser pulse). By implementing the buffer layer of the present invention, the optimal processing window where high quality samarium-barium-copper oxide films could be reproducibly produced was broadened significantly.

In the case of $SrTiO_3$ substrate, the highest $T_c$ obtained without the buffer layer in the range of deposition temperatures from 765° C. to 790° C. and at deposition rates or frequency of laser pulse of 5 MHz or 10 MHz was 85 K. By implementing the buffer layer of the present invention, a higher $T_c$ was obtained at a temperature of 775° C. and at 10 MHz. Again, the optimal processing window where high quality samarium-barium-copper oxide films could be reproducibly produced was broadened significantly.

While not wishing to be bound by the present explanation, the improvement is believed due to the change of initial film growth chemistry for the samarium-barium-copper oxide film by the yttrium-barium-copper oxide buffer layer. Chemistry of other RE123 materials containing large ionic size of $RE^{3+}$ shows the possibility of substitution of $RE^{3+}$ for the barium ion ($Ba^{2+}$) because of the similarity in size. The substitution disturbs the superconductivity and reduces $T_c$.

When samarium-barium-copper oxide is deposited on a dielectric oxide substrate, there is the possibility of the rare earth being in the barium site and the amount of the substitution may vary depending upon the deposition conditions and substrate (explaining the difference among substrates in the values in Table 1). On the other hand, samarium-barium-copper oxide deposited on yttrium-barium-copper oxide, which has a small rare earth ion ($y^{3+}$) and does not have the problem of yttrium substituting for barium, experiences different initial film growth chemistry. The well-ordered yttrium-barium-copper oxide buffer layer seems to prevent the substitution and to lock the position of samarium.

Further study of various buffer layers has been performed using Pr123 and homoepitaxially grown $LaAlO_3$. Pr123 has similar crystal structure and lattice constants with a severe problem of the praseodymium substituting for the barium. $LaAlO_3$ has shown passivation of a $LaAlO_3$ substrate for inborn defect structures. Neither of these buffer layers has been shown to improve either the $T_c$ or the $J_c$ of a superconducting samarium-barium-copper oxide film.

Figure 4:
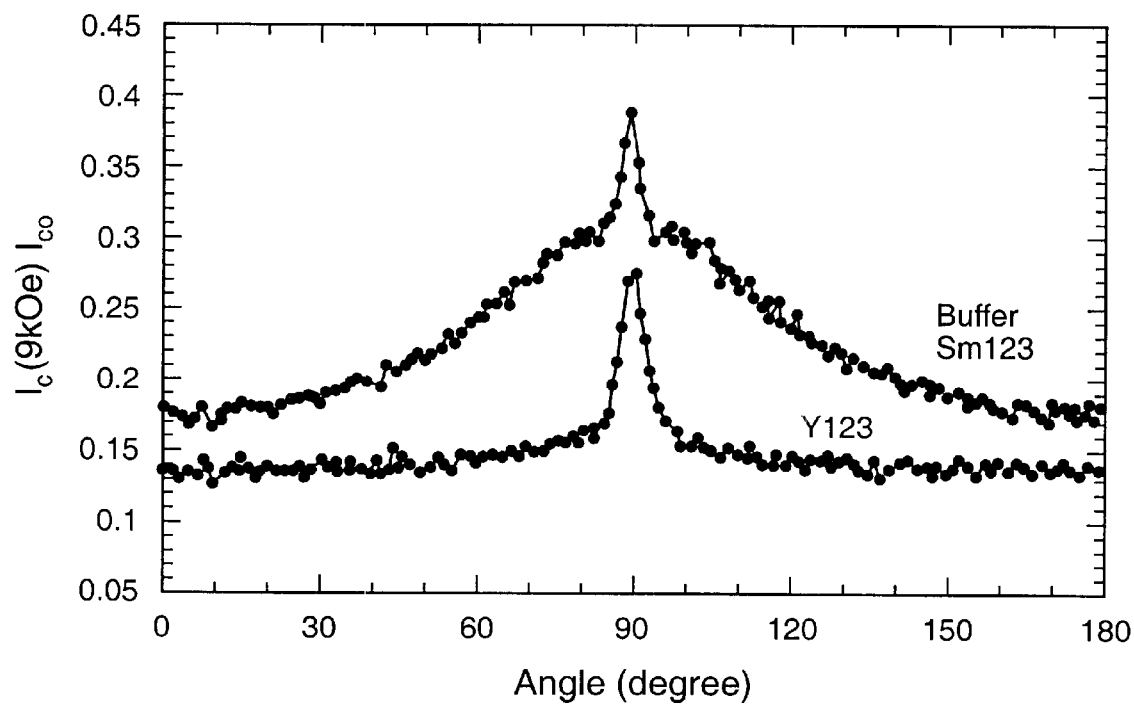
FIG. 4 shows a comparison of angle dependence ($I_c/I_{co}$) between a superconducting yttrium-barium-copper oxide film and a superconducting samarium-barium-copper oxide film including a buffer layer of superconducting yttrium-barium-copper oxide in accordance with the present invention.

Further study on properties of the structures of the present invention has compared the superconducting samarium-barium-copper oxide film with the yttrium-barium-copper oxide buffer layer on a substrate and a yttrium-barium-copper oxide layer on a similar substrate. The superconducting samarium-barium-copper oxide film with the yttrium-barium-copper oxide buffer layer showed stronger pinning and improved $I_c$(9 kOe)/$I_{co}$, the normalized $I_c$ in fields (H=9 kOe), as seen in FIG. 4.

Also, improved surface morphology has been found in superconducting samarium-barium-copper oxide film with the yttrium-barium-copper oxide buffer layer in comparison to a yttrium-barium-copper oxide layer alone.

These results demonstrate that introduction of a yttrium-barium-copper oxide buffer layer between a rare earth-barium-copper oxide film and a dielectric oxide substrate can achieve improved $T_c$ and $J_c$ properties for a rare earth-barium-copper oxide film such as a samarium-barium-copper oxide film than in the absence of the buffer layer.

EXAMPLE 2

A structure with a substrate of $LaAlO_3$ was formed with a buffer layer of superconducting silver-doped yttrium-barium-copper oxide and a superconducting neodymium-barium-copper oxide film. The thin films of silver-doped yttrium-barium-copper oxide and neodymium-barium-copper oxide were deposited onto the substrates by in situ pulsed laser deposition (PLD) at a temperature of 775° C. using a 308 nm XeCl excimer laser. The thin film of silver-doped yttrium-barium-copper oxide was deposited from a target including 5 percent by weight silver. The oxygen pressure was 200 mTorr for the deposition of the silver-doped yttrium-barium-copper oxide and 150 mTorr for the deposition of the neodymium-barium-copper oxide.

The superconducting transition temperature was measured as 89.7 K for this structure with a sharp transition width of only about 0.6 K. Another run under similar conditions had a superconducting transition temperature of 90.6 K with an equally sharp transition width.

These results demonstrate that introduction of a yttrium-barium-copper oxide buffer layer between a rare earth-barium-copper oxide film of neodymium-barium-copper oxide and a dielectric oxide substrate can achieve high $T_c$ properties for the rare earth-barium-copper oxide film under broadened processing conditions. Previously, temperatures of at least about 850–900° C. had been required to obtain superconducting transition temperatures greater than about 88 K for neodymium-barium-copper oxide.

Although the present invention has been described with reference to specific details, it is not intended that such details should be regarded as limitations upon the scope of the invention, except as and to the extent that they are included in the accompanying claims.

What is claimed is:

1. A superconducting structure comprising:
   a dielectric oxide substrate;
   a thin buffer layer of a yttrium-barium-copper oxide superconducting material having a thickness of from about 5 nanometers to about 50 nanometers thereon; and, a layer of a rare earth-barium-copper oxide superconducting film thereon said thin buffer layer of yttrium-barium-copper oxide superconducting material, said rare earth selected from the group consisting of samarium, gadolinium, ytterbium, erbium, neodymium, dysprosium, holmium, lutetium, a combination of more than one element from said rare earth group and a combination of one or more elements from said rare earth group with yttrium, said thin buffer layer of yttrium-barium-copper oxide superconducting material characterized as having chemical and structural compatibility with said dielectric oxide substrate and said rare earth-barium-copper oxide superconducting film, wherein combination of said thin buffer layer of a yttrium-barium-copper oxide superconducting material and rare earth-barium-copper oxide superconducting film on said dielectric substrate yields a higher transition temperature than the same rare earth-barium-copper oxide superconducting film on said dielectric substrate in the absence of said thin buffer layer.

2. The structure of claim 1 wherein said buffer layer of yttrium-barium-copper oxide further includes silver.

3. The structure of claim 1 wherein said dielectric oxide substrate is of a material selected from the group consisting of lanthanum aluminum oxide, strontium titanium oxide, magnesium oxide, neodymium gadolinium oxide, and a cerium oxide/yttria-stabilized zirconia.

4. The structure of claim 1 wherein said rare earth-barium-copper oxide is samarium-barium-copper oxide.

5. The structure of claim 1 wherein said rare earth-barium-copper oxide is neodymium-barium-copper oxide.

6. The structure of claim 3 wherein said rare earth-barium-copper oxide is samarium-barium-copper oxide.

7. The structure of claim 3 wherein said rare earth-barium-copper oxide is neodymium-barium-copper oxide.

8. The structure of claim 1 wherein said dielectric oxide substrate is of strontium titanium oxide.

* * * * *